United States Patent [19]
Lin et al.

[11] Patent Number: 6,018,622
[45] Date of Patent: Jan. 25, 2000

[54] METHOD FOR REDUCING CIRCUIT AREA BY GROUPING COMPATIBLE STORAGE DEVICES

[75] Inventors: Arthur Lin, San Jose; Kui K. Yau, Saratoga; Yuncheng F. Yu, Palo Alto, all of Calif.

[73] Assignee: Sun Microsystems, Inc., Palo Alto, Calif.

[21] Appl. No.: 08/936,647

[22] Filed: Sep. 24, 1997

[51] Int. Cl.$^7$ .................................................. G06F 17/50
[52] U.S. Cl. .............................. 395/500.03; 395/500.13
[58] Field of Search ..................... 395/500.02, 500.03, 395/500.12, 500.13, 500.19, 500.18, 500.09

[56] References Cited

U.S. PATENT DOCUMENTS

| | | | |
|---|---|---|---|
| 4,849,904 | 7/1989 | Aipperspach et al. | 395/500.18 |
| 5,150,308 | 9/1992 | Hooper et al. | 364/489 |
| 5,586,319 | 12/1996 | Bell | 395/701 |
| 5,956,257 | 9/1999 | Ginetti et al. | 364/490 |

OTHER PUBLICATIONS

Kahng et al., "High–Performance Clock Routing Based on Recursive Geometric Matching," 28$^{th}$ ACM/IEEE Design Automation Conference, pp. 322–327. No Date.

*Primary Examiner*—Kevin J. Teska
*Assistant Examiner*—Leigh Marie Garbowski
*Attorney, Agent, or Firm*—Conley, Rose & Tayon; Lawrence J. Merkel; B. Noel Kivlin

[57] ABSTRACT

In a control block design methodology, a control block is designed, synthesized, and laid out. The control block includes one or more storage devices, such as flops. The flops include a header which buffers signals common to the flops and a storage cell for storing data. A flop grouping tool is used to merge flops having the same type of header into a flop having storage equivalent to the merged flops but using a single header. Multiple instances of the header may be deleted from the control block.

23 Claims, 7 Drawing Sheets

METHOD FOR REDUCING CIRCUIT AREA BY GROUPING COMPATIBLE STORAGE DEVICES

BACKGROUND OF THE INVENTION

1. Field of the Invention

This invention is related to the field of integrated circuits and, more particularly, to reducing area occupied by a control block within an integrated circuit.

2. Description of the Related Art

Integrated circuits comprise millions of transistors fabricated upon a semiconductor substrate, interconnected by several metal wiring layers placed atop the semiconductor substrate. Generally, integrated circuits include a data flow comprising one or more predesigned hardware elements (e.g. adders, multiplexors, comparators, memories, etc.) and one or more control blocks. The control blocks include the combinatorial logic which controls the data flow hardware in order to implement the specified function of the integrated circuit. In addition to the combinatorial logic, control blocks often include storage devices for storing outputs of the combinatorial logic. Using the combinatorial logic in conjunction with the storage devices, sequential state machines and pipelining may be implemented (among other things).

Each control block occupies a certain amount of semiconductor substrate area, which is determined by the number of cells included in the control block as well as the interconnect therebetween. A cell is a predesigned circuit implementing a particular logic function. For example, storage devices may be implemented as a cell. Additionally, combinatorial logic gates may be implemented as cells. Both simple combinatorial gates (e.g. nand, nor, and, or, etc.) and complex combinatorial logic represented by an equation of simple combinatorial gates may be implemented in cells. Complex combinatorial logic may be implemented as a cell if the corresponding equation is often used in the control block or if the combinatorial logic can be implemented in a smaller amount of area by integrating the gates forming the equation. Generally, a library of cells is provided for realizing a control block within the integrated circuit. The control block may include as many instances of each type of cell as desired to realize the function of the control block. An "instance" is one copy of the cell, which can be interconnected with other instances of the same or a different cell to perform a function. The instances are connected via interconnect wiring to realize each equation in the control block.

The total area occupied by the control blocks and data flow is the area occupied by the integrated circuit. The cost of manufacturing the integrated circuit is generally directly related to the area occupied by the integrated circuit. The smaller the area occupied by the integrated circuit, the more integrated circuit die can be placed upon a single semiconductor wafer of a particular size. The cost of the wafer and the cost of its passage through the semiconductor fabrication process may be amortized over more integrated circuit units if the area occupied by a unit is smaller, thereby lowering the cost. Additionally, the yield (i.e. functional die as a percentage of total die fabricated upon a wafer) may be increased by the inclusion of more die per wafer. An individual defect in the wafer or introduced in the manufacturing process may cause at least one die to be non-functional, but the inclusion of more die on the wafer dilutes the effect of each non-functional die and may therefore lead to a larger percentage of functional die.

Therefore, it is desirable to develop techniques which reduce the amount of area occupied by an integrated circuit.

SUMMARY OF THE INVENTION

The problems outlined above are in large part solved by a methodology for designing a control block in accordance with the present invention. In the methodology described herein, a control block is designed, synthesized, and laid out. The control block includes one or more storage devices, such as flops. The flops include a header which buffers signals common to the flops and a storage cell for storing data. A flop grouping tool is used to merge flops having the same type of header into a flop having storage equivalent to the merged flops but using a single header. Multiple instances of the header may be deleted from the control block. Semiconductor substrate area may be saved through the deletion of headers. Advantageously, a smaller control block area may be realized. The smaller control block may subsequently lead to a smaller integrated circuit area, thereby reducing manufacturing cost per die and increasing manufacturing yield. Furthermore, timing advantages may be realized by the smaller control block due to a reduction in interconnect length.

Broadly speaking, the present invention contemplates a method for reducing the area occupied by a control block. A first group of storage devices is identified within the control block. The first group of storage devices each include a first header. A first storage device and a second storage device are selected from the first group for replacement by a first merged storage device. The first merged storage device includes the first header and storage corresponding to the first storage device and the second storage device. In this manner, an instance of the first header is deleted from the control block.

The present invention further contemplates a method for reducing the area occupied by a control block. A first storage device and a second storage device are identified within the control block. The first storage device includes a first header and a first storage cell connected to the first header. The second storage device includes a second header and a second storage cell connected to the second header. The first header and the second header are configured to receive a same set of signals. The first storage device and the second storage device are replaced with a first merged storage device including the first header, the first storage cell connected to the first header, and the second storage cell connected to the first header. The second header is deleted from the control block in this fashion.

Still further, the present invention contemplates a computer storage medium configured to store a grouping program including a plurality of instructions. The plurality of instructions are configured to identify a first group of storage devices within a control block. The first group of storage devices each include a first header. Additionally, the plurality of instructions are configured to select a first storage device and a second storage device within the first group for replacement by a first merged storage device having the first header and storage corresponding to the first storage device and the second storage device. In this manner, an instance of the first header is deleted from the control block.

BRIEF DESCRIPTION OF THE DRAWINGS

Other objects and advantages of the invention will become apparent upon reading the following detailed description and upon reference to the accompanying drawings in which.

Figure 1:
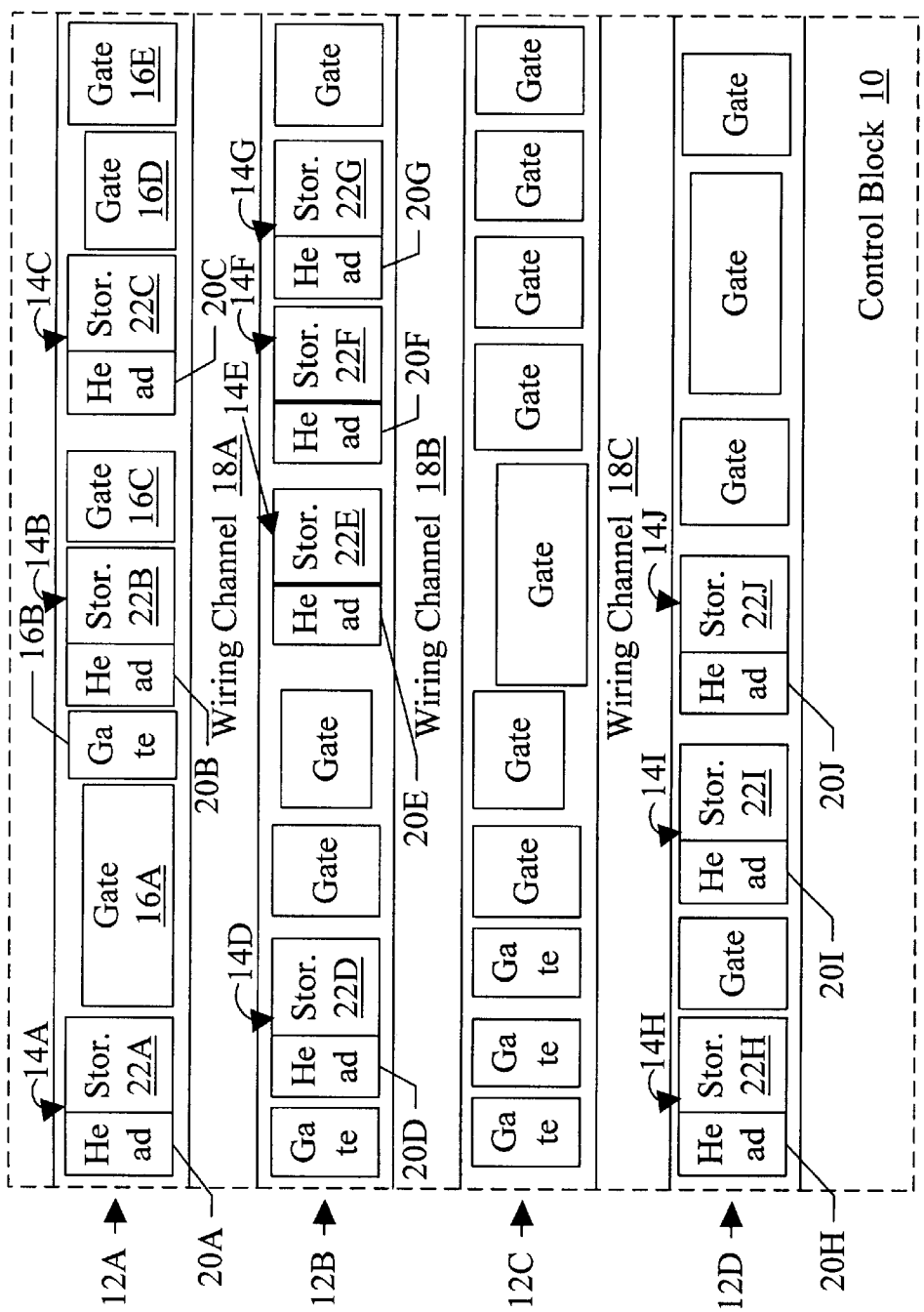
FIG. 1 is a block diagram of a physical layout of one embodiment of a control block.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a simplified block diagram of an exemplary physical layout of one embodiment of a control block 10 is illustrated. FIG. 1 illustrates the layout of control block 10 at the cell level (i.e. the internal structure of each cell is omitted in FIG. 1, and instead the boundaries of each cell are shown). Control block 10 is organized as a plurality of rows of cells (e.g. rows 12A–12D as illustrated in FIG. 1). Flip-flop cells (or "flop") cells are illustrated within various rows 12A–12D (e.g. flop cells 14A–14C within row 12A, flop cells 14D–14G within row 12B, and flop cells 14H–14J within row 12D). Additionally, each row includes other types of cells such as gate cells (e.g. gate cells 16A–16E). Finally, wiring channels 18A–18C are illustrated between rows 12A–12D. The number of rows within control block 10 may be varied from embodiment to embodiment, as may the number of cells within a row. Interconnection between cells is omitted from FIG. 1 for simplicity.

Flop cells 14A–14J each include respective headers 20A–20J and respective storage cells 22A–22J. Generally, a storage device (e.g. a flop or other clocked storage device such as a register, a latch, etc.) includes a header and a storage cell. While flop cells 14A–14J are used as an example herein, it is noted that any storage device may be used with the present methodology for reducing integrated circuit area. Each storage cell 22A–22J includes the transistors which implement the storage for the information being stored in the corresponding flop cell 14A–14J. For example, each flop cell 14A–14J may store a bit. The header, on the other hand, provides buffering for signals which are common to each storage device (i.e. signals which are routed from a source to each storage device). For example, the clock signal is common to each of the storage devices within control block 10, in that each storage device receives the clock signal. Additionally, signals such as reset, scan enable, etc. may be common signals. On the other hand, signals such as the data input and output signals are not common to each storage device (i.e. different storage devices receive data input signals from different sources and source different data output signals). Buffering may be inserted between the common signals of the storage devices, but logically the same signal is routed to each storage device.

Headers 20A–20J may present a smaller capacitive load to the signal lines carrying the signals connected to the headers than may be presented by transistors within the corresponding storage cells 22A–22J. The transistors within storage cells 22A–22J are sized to provide the proper switching action within the storage cell (e.g. they are sized with respect to other transistors within the storage cell). On the other hand, a string of buffers may present a small capacitance to the common signal lines but may amplify the signals to drive the larger capacitances within the storage cells 22A–22J.

While control block 10 as shown in FIG. 1 employs single bit flop cells 14A–14J, multiple bit flop cells may be designed using a single header 20A–20J and multiple storage cells 22A–22J. The single header may provide the common signals to each of the multiple storage cells 22A–22J, providing further buffering for the common signal lines. The multiple bit flop cells may replace a set of single bit flop cells as long as the headers corresponding to each of the single bit flop cells receive the same set of signal lines. As used herein, a pair of headers are referred to as "compatible" if the same set of signal lines are received by each of the pair of headers. Therefore, a multiple bit flop cell may replace a set of single bit flop cells having compatible headers. Advantageously, the area occupied by control block 10 may be reduced by the area occupied by each of the headers which are deleted from control block 10 by replacing a set of single bit flop cells 14A–14J with a multiple bit flop cell. As control block 10 (and other control blocks in an integrated circuit) are reduced in size, the overall size of the integrated circuit may be reduced. Costs incurred to manufacture the integrated circuit may thereby be reduced.

Gate cells such as gate cells 16A–16E are cells including transistors which form combinatorial logic devices. Simple logic devices such as buffers, inverters, nand gates, nor gates, etc. may be formed within a gate cell. Additionally, more complex cells which implement a combinatorial logic function may be designed. The more transistors included within a cell, the wider the cell may be. Generally, each cell is approximately the same height although some variation in height may be allowed (e.g. gate cell 16A is slightly shorter than other gate cells).

Wiring channels 18A–18C are provided to allow for additional wiring. Wiring may be performed above rows 12A–12D, but often times the amount of wiring available above the rows is insufficient for interconnecting all of the cells. For example, a cell in one row may be connected to another cell in the same row or a different row but in a position which is distant from that cell. The wire connecting the two cells may be routed through wiring channels 18A–18C instead of over the intervening cells.

Figure 2:
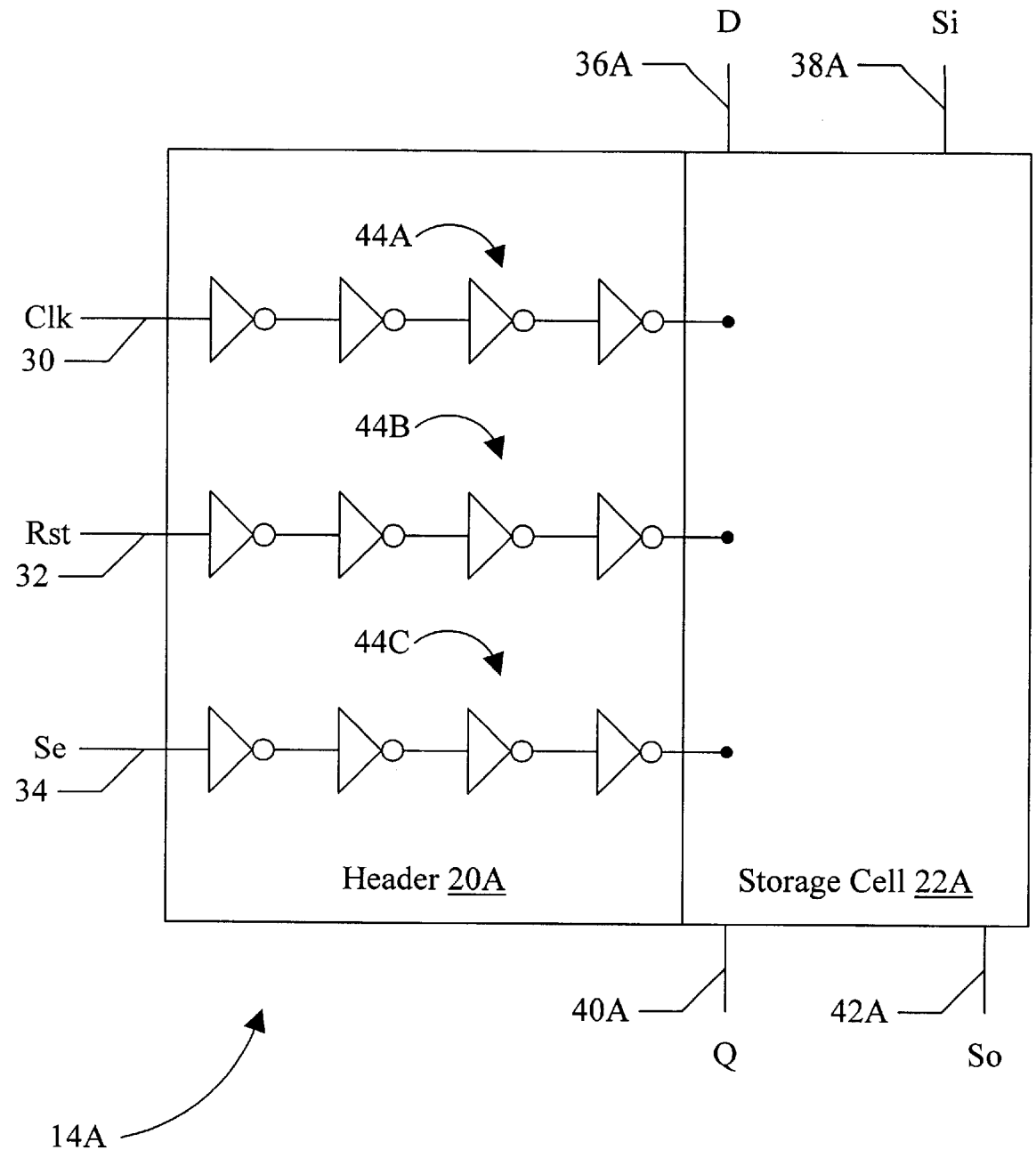
FIG. 2 is a block diagram of one embodiment of a flop cell.

Turning now to FIG. 2, a more detailed block diagram of one embodiment of flop cell 14A is shown. Other flop cells may be configured similarly. Additionally, other types of storage devices may include similar headers as that shown in FIG. 2, or may include different headers. As shown in FIG. 2, flop cell 14A includes header 20A and storage cell 22A.

For the embodiment of FIG. 2, header 20A receives a clock line 30, a reset line 32, and a scan enable line 34. In the embodiment shown, storage cell 22A receives a data input line 36A, a scan in line 38A, a data output line 40A, and a scan out line 42A. Storage cell 22A may be of any suitable design, and therefore details of storage cell 22A are omitted for simplicity in the drawing.

Header 20A includes several serially coupled inverter chains 44A, 44B, and 44C. Inverter chain 44A is coupled between clock line 30 and storage cell 22A. Similarly, inverter chain 44B is coupled between reset line 32 and storage cell 22A and inverter chain 44C is coupled between scan enable line 34 and storage cell 22A. Inverter chains 44A–44C are configured to buffer the lines 30–34 to which they are connected, presenting a smaller load than the lines would experience if directly connected to storage cell 22A. Furthermore, the signals upon lines 30–34, since they are provided to a large number of storage cells, may have degraded rise and fall times due to the large load. Inverter chains 44A–44C may restore the rise and fall times to short values for driving the storage cell 22A. It is noted that non-inverting buffer chains may be substituted for inverter chains 44A–44C.

The above description refers to coupling the inverter chains 44A–44C to storage cell 22A. The inverter chains are connected to transistors within storage cell 22A in the fashion that the signal lines 30–34 would be connected if header 20A were not included. For example, for CMOS technology the inverter chains are connected to the gate terminal of one or more transistors which are arranged to provide the appropriate function based on the state of the signal upon the corresponding line 30–34.

Figure 3:
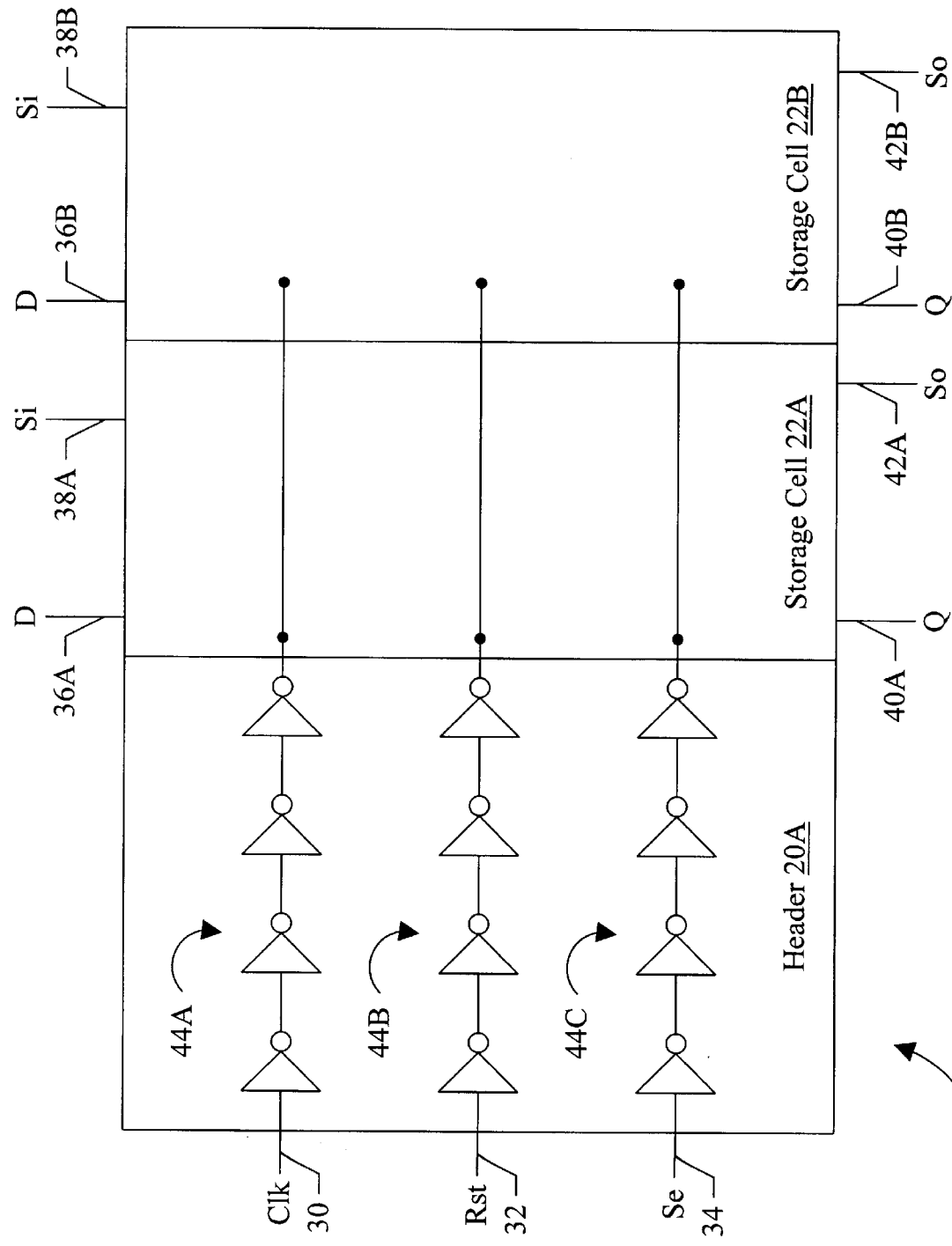
FIG. 3 is a block diagram of one embodiment of a multibit flop cell.

Turning now to FIG. 3, one embodiment of a multibit flip flop 50 is shown. For the embodiment shown, multibit flip flop 50 comprises header 20A, storage cell 22A, and storage cell 22B. Similar to FIG. 2, header 20A receives clock line 30, reset line 32, and scan enable line 34. Inverter chains 44A–44C are coupled to lines 30–34, respectively. The outputs of inverter chains 44A–44C are connected to both storage cells 22A and 22B. Therefore, header 20A provides the common signals to both storage cells 22A and 22B. A separate header for storage cell 22B is not needed, and area formerly occupied by the separate header is freed for use by other cells or for providing a smaller total area of control block 10.

Storage cell 22A receives lines 36A, 38A, 40A, and 42A. Similarly, storage cell 22B receives lines 36B, 38B, 40B, and 42B. These lines may be distinct from lines 36A, 38A, 40A and 42A, while lines 30, 32, and 34 are shared by the two storage cells.

While flip flop 50 includes two storage cells as shown in FIG. 3, more than two storage cells may be included and may share header 20A. As more storage cells are included, the amount of area freed is increased because more headers are removed from the resulting control block. In one particular embodiment, multibit flip flops having between two and four bits of storage are provided as storage devices. In another particular embodiment, multibit flip flops having between two and eight bits of storage are provided.

Figure 4:
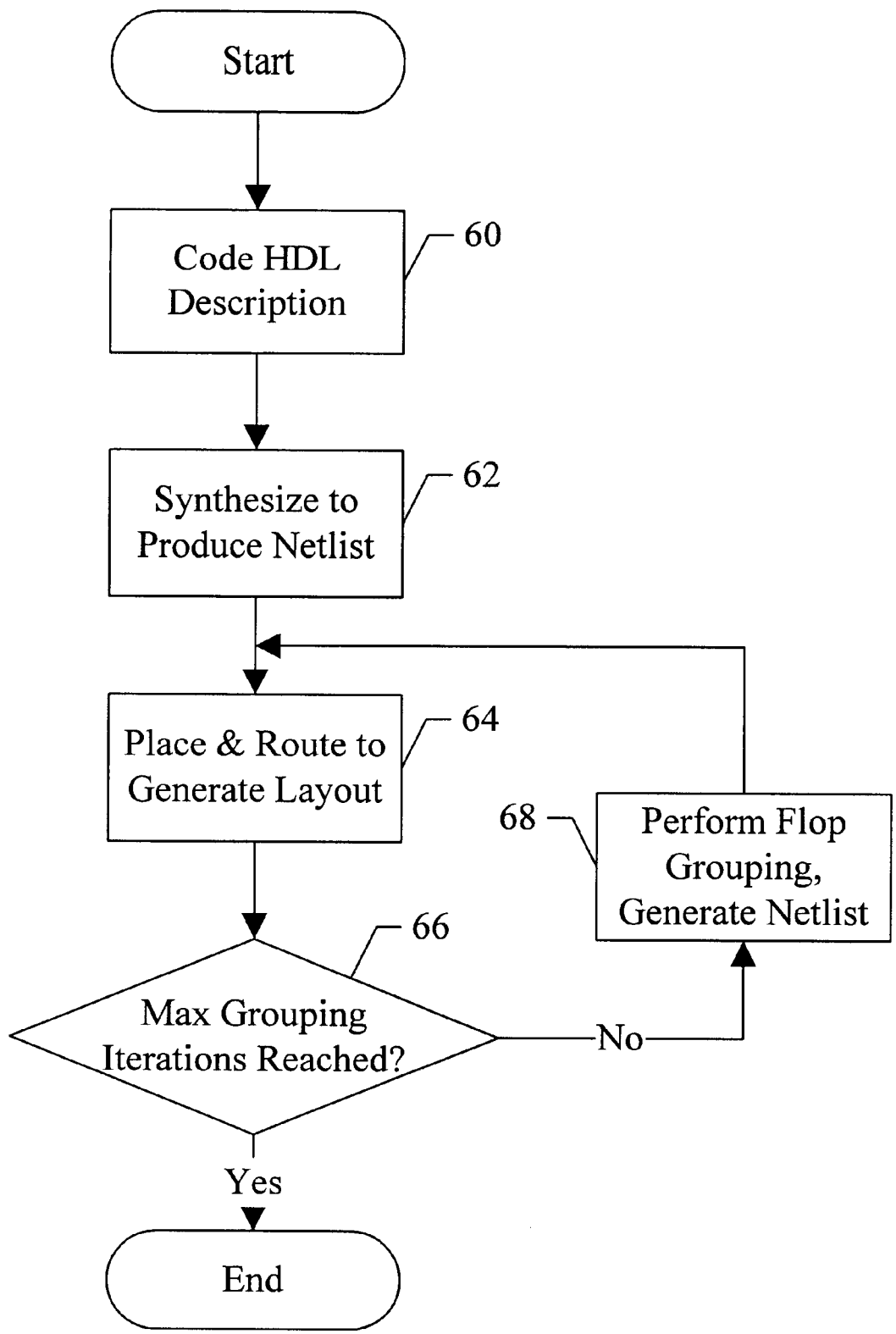
FIG. 4 is a flowchart illustrating one embodiment of a design methodology for a control block within an integrated circuit.

Turning next to FIG. 4, a flowchart is shown illustrating one embodiment of a design methodology which may be used to design control block 10. Other embodiments are possible as well. A high-level design language (HDL) description of the control block is coded by the control block designer (step 60). An HDL is a programming language for representing a logic design. Generally, high level logical equations can be written in the HDL to represent the function to be performed by the corresponding control block. The high level equations may employ any logical function, and may not necessarily correspond directly to a cell within a cell library designed for use when synthesizing the control block. Particular cells can be coded into the HDL description as well. For example, the HDL description may include explicit coding of cell instances for the storage devices included in the control block. The storage devices are used for storing information generated by the control block for use during a subsequent clock cycle. The storage devices may store states of a state machine employed within the control block, or store values to be communicated to other control blocks or data flow elements during a subsequent clock cycle. Exemplary HDLs may include Verilog and VHDL.

Upon completing the HDL description of the control block, the control block is synthesized using a suitable synthesis tool (step 62). The synthesis tool uses the cells within the cell library to develop a logic circuit which implements the equations coded in the HDL description. Additionally, the synthesis tool receives timing information corresponding to each cell and a desired clock cycle time and area for the control block. The synthesis tool attempts to realize the HDL description using the available cells to produce a logic circuit which meets the timing and area parameters. The output of the synthesis tool is a netlist. A netlist is a list of cell instances along with interconnect between the cell instances. The cell instances, interconnected as specified in the netlist, provide a logic circuit which implements the control block as specified in the HDL description. It is noted that synthesis of the HDL description may be replaced with other methods of generating a netlist. For example, schematic entry of a logic circuit and schematic capture may be used to generate a netlist.

In the present embodiment, single bit flop cells such as flop cells 14A–14J are provided as storage devices in the cell library used by the synthesis tool. Instances of the single bit flop cells are provided in the netlist for each bit of storage used by the control block corresponding to the HDL description and corresponding netlist. By using single bit flop cells, the combinatorial logic between the flop cells may be placed in a physical layout description in a highly efficient manner. If the multibit flop cells were used, since the storage cells within the multibit flop cells are physically adjacent to each other, then the logic cells connected to the inputs and outputs of the storage cells within the multibit flop cells would tend to be placed near the multibit flop cell (in order to achieve reasonable timing characteristics). Therefore, inefficiencies caused by a poor selection of the bits to be stored in the multibit flop cell may be introduced.

The netlist resulting from the synthesis step 62 lists the cells which implement the control block, but does not contain information about how the cells are to be arranged (or "laid out") on the silicon substrate. The cell instances specified by the netlist are placed and routed to form a physical layout description using a suitable place and route tool (step 64). In one embodiment, suitable synthesis and place and route tools may be the Arccell tool suite available from Avant! Corporation, Fremont, Calif. The place and route tool determines locations within a physical layout of the control block at which each cell instance should be placed. Among other things, the place and route tool attempts to place interconnected cells near each other to minimize the amount of wire routing between the cells. After placing the cell instances, wiring is routed between the cells to perform the interconnection specified in the netlist. A circuit which can be formed upon a semiconductor substrate is thereby developed.

In one embodiment, the netlist produced by synthesis is placed by the place and route tool, but routing is not performed. The placement information (e.g. location, rotation, mirror, etc.) is used by the flop grouping tool to group flops. Since the placement of flops may be modified by flop grouping, routing of the wires between cells may be delayed, for example, until the last flop grouping iteration.

After placing and routing the netlist provided from synthesis step 62, flop grouping is performed to merge single bit flops into a multiple bit flop based upon the location of the single bit flops within the physical layout description produced by place and route step 64. A predefined number of grouping iterations are performed to merge flops into multibit flops. Each multibit flop has sufficient storage for the flops merged into that multibit flop.

In the present embodiment, sets of two flops are merged with each other during each iteration of flop grouping. A set of two flops may include: (i) two single bit flops or (ii) a multibit flop and a single bit flop. Therefore, the predefined number of grouping iterations is in part determined by the number of bits available in the multibit flop circuits. For example, in one embodiment up to four bits are available in a multibit flop circuit. Therefore, three iterations of flop grouping may be performed for that embodiment.

If the maximum number of flop grouping iterations have not yet been performed (decision block 66), then an iteration of flop grouping is performed and an updated netlist is generated (step 68). The updated netlist includes a multibit flop cell instance for each set of merged flops detected during that flop grouping iteration. The corresponding grouped flops have been deleted from the updated netlist as well.

The updated netlist is provided to the place and route tool (step 64). The corresponding layout description may occupy less semiconductor substrate area, due to the reduction in the number of headers included in the layout description as compared to the layout description prior to the flop grouping iteration. Since the cells within the control block are closer together, timing characteristics may be improved as well due to reduced wire lengths between cells.

The flop grouping iterations (e.g. steps 66 and 68) may be performed by a flop grouping tool. The flop grouping tool may also invoke the place and route tool to perform the place and route step 64 after each iteration of steps 66 and 68. Generally, the flop grouping tool uses the physical layout description provided by the place and route tool to determine the locations of each of the flop cell instances within the control block. The flop grouping tool attempts to merge flops which are physically located near each other and which are compatible into a multibit flop. The merging of each set of flops into a corresponding multibit flop causes the deletion of a header from the corresponding control block physical layout. In one embodiment, sets of two flops (one of which may be a multibit flop) are selected to be merged with each other. As many sets of mergeable flops as possible are selected during each iteration of flop grouping to maximize the amount of area saved. It is noted that, during iterations after the first iteration of flop grouping, multibit flops which are the result of merging single bit flops in a prior iteration may be selected for merging with yet another single bit flop. In this manner, a three-bit multibit flop may be inserted for three single bit flops via two iterations of flop grouping. Similarly, a four-bit multibit flop may be inserted for four single bit flops via three iterations of flop grouping, etc.

Figure 5:
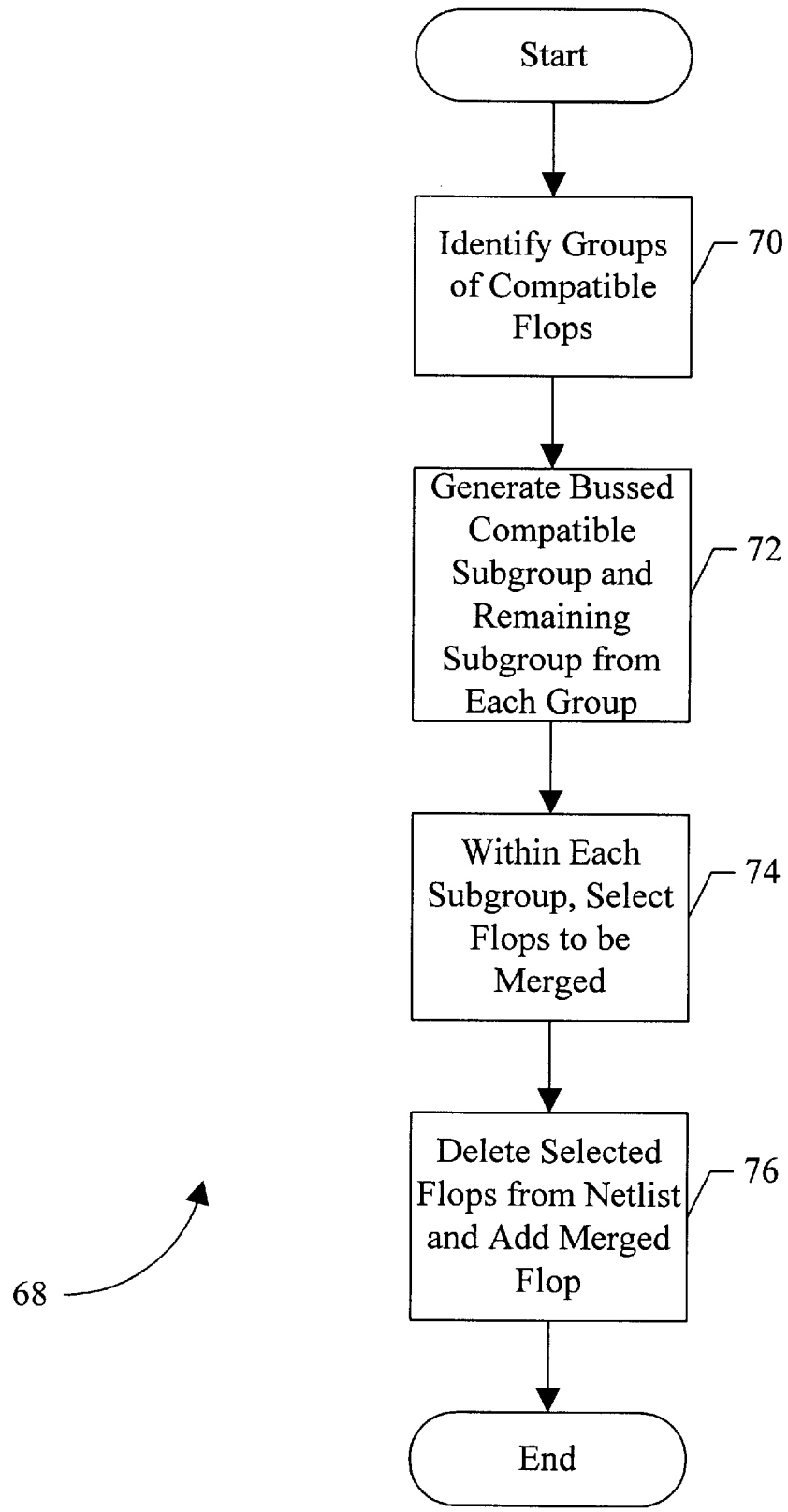
FIG. 5 is a flowchart illustrating one embodiment of a flop grouping step shown in FIG. 4.

Turning next to FIG. 5, a flowchart illustrating one embodiment of flop grouping step 68 is shown. Other embodiments are possible as well. Flop grouping step 68 may be implemented in a flop grouping tool as described above.

The flop grouping tool identifies groups of compatible flops (step 70). As described above, flops are compatible if they have the same header (i.e. the same set of signals are received by the header). Different types of flops may have different headers. Each header type is assigned a different group, and flops having that header are placed into that group. Flops may be single bit or multibit (after the first grouping iteration, in one embodiment), but are still placed into the same groups based on the header type.

For each group formed in step 70, the flop grouping tool generates bus compatible subgroups and a remaining subgroup (step 72). Flops are bus compatible if their data input and output lines are part of the same bus. Generally, a bus is a set of two or more lines which are logically grouped together to form a value as a whole. For example, a 32 bit data value is transmitted upon a bus having 32 lines, each of which carries one of the bits. Each line is assigned to one of the bits, and the 32 bit value can be reconstructed by ordering the lines based upon which bit each line is assigned to. Typically, the lines forming a bus are named (in the HDL description and the netlist) with a signal name and a subscript indicating which bit of the bus is assigned to that line (e.g. bus [0], bus [1], etc.). Different busses are assigned different signal names (e.g. bus 1[15:0] refers to a different bus than bus 2[15:0]). Therefore, the flop grouping tool may form a bus compatible subgroup corresponding to each bus signal name. Flops which are not bus compatible with other flops are placed into the remaining subgroup.

The flop grouping tool then selects flops within each subgroup for merging (step 74). A variety of algorithms may be used to select mergeable flops. Generally, it may be useful to select flops which are located near each other (determined by reading row and position within the row information from the physical layout description). In various embodiments, one of the following selection algorithms may be used:

(i) each flop within the subgroup is placed, according to its position within the physical layout, within a region representing the control block. The region is then recursively bisected until two flops remain within a bisected region. These two remaining flops are selected to be merged with each other, and are removed from the region representing the control block. The process is repeated until all flops within the subgroup have been selected (one flop may remain if an odd number of flops are within the subgroup).

(ii) the pair of flops within the subgroup which are nearest each other (spatially) are located and selected for merging with each other. The selected flops are removed from the subgroup and the process repeated until all flops within the subgroup have been selected (one flop may remain if an odd number of flops are within the subgroup).

(iii) a space filling curve is set up to induce a Hamiltonian cycle through the points, and the best embedded matching is chosen.

Other selection algorithms are possible as well. It is noted that the above selection algorithms are described with respect to clock tree routing in a paper entitled: "High-Performance Clock Routing Based on Recursive Geometric Matching" by Kahng, et al., $28^{th}$ ACM/IEEE Design Automation Conference, 1991, pages 322–327, incorporated herein by reference in its entirety.

The flop grouping tool deletes the cell instances corresponding to each selected pair of flops from the netlist and inserts the corresponding multibit flop instance into the netlist to form the updated netlist (step 76).

It is noted that, while in one embodiment the flop grouping tool may attempt to group all flops within a subgroup, in other embodiments flops may be grouped until the remaining flops in the subgroup are separated from each other by at least a maximum predetermined distance. The maximum predetermined distance may be experimentally determined to be a distance at which area saved by merging flops is outweighed by area increases incurred due to large changes in the placement of other cells.

Figure 6:
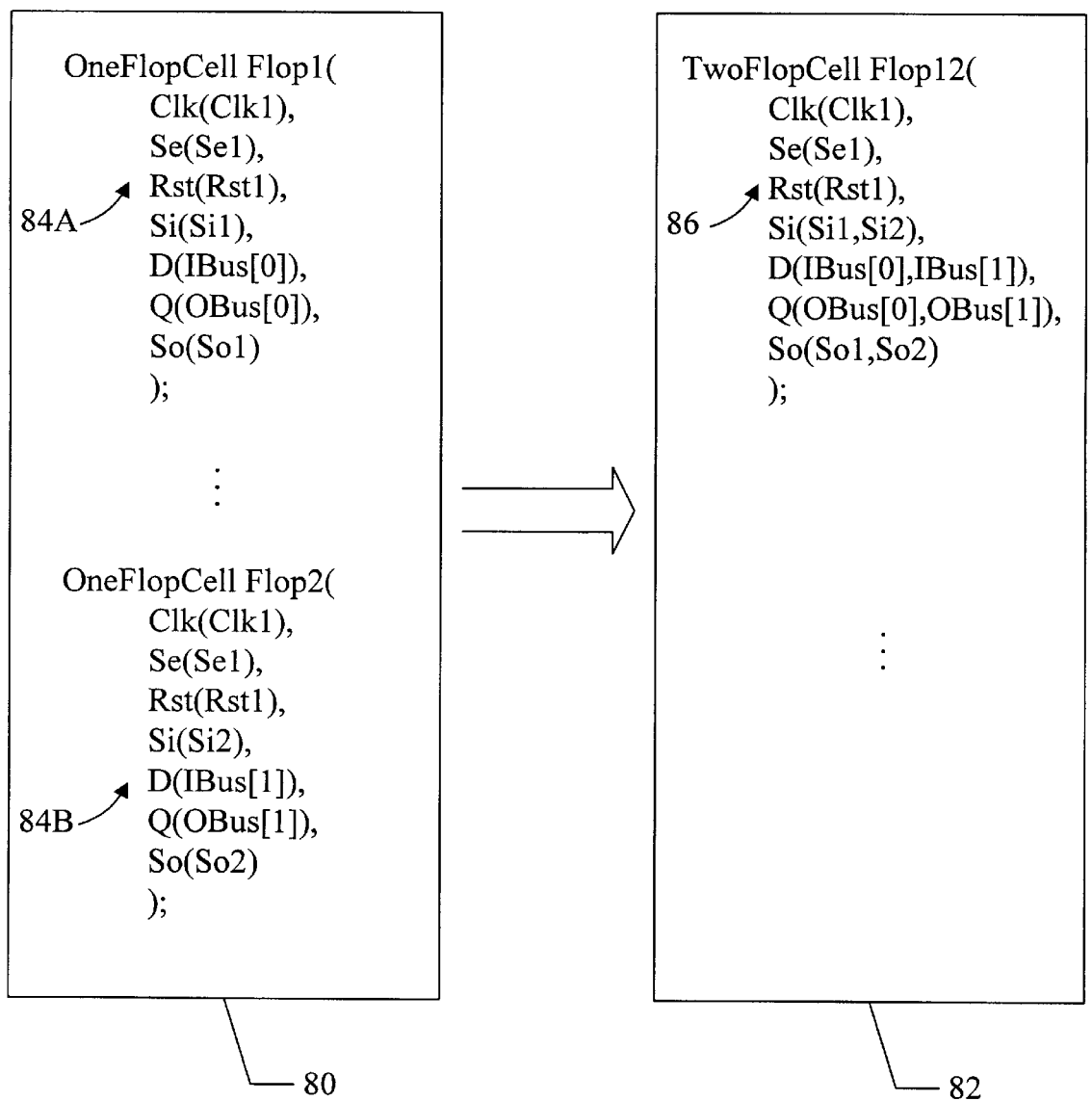
FIG. 6 is a diagram illustrating an exemplary netlist before and after performing flop grouping.

Turning now to FIG. 6, a portion of an exemplary netlist 80 and a portion of an updated netlist 82 after a flop grouping iteration are shown. It is noted that netlists may be formatted in many different manners depending upon the software used to produce the netlist. However, the netlist entries generally identify the cell type for that instance, the instance name, and the input and output signals of the cell with signal names of lines connected to those inputs and outputs for the particular instance.

Netlist 80 includes two flop cell instances 84A and 84B. The cell type OneFlopCell, in this example, refers to a single bit flop cell. Instance names Flop1 (for instance 84A) and Flop2 (for instance 84B) are assigned. Inputs and outputs of the cell are listed, with the signal name connected to each input or output for the particular instance listed in parentheses.

Updated netlist 82 is created by the flop grouping tool after a flop grouping iteration in which Flop1 and Flop2 are selected for merging. The Flop1 and Flop2 instances have been deleted and a Flop12 instance 86 of the cell TwoFlopCell has been created. TwoFlopCell includes storage equivalent to two OneFlopCell cells in this example. The common inputs (clock, reset, and scan enable) are provided to Flop12 only once, while the non-common inputs (scan in and out and data in and out) are provided two signal names each. The provided signal names correspond to the non-common signal names originally connected to Flop1 and Flop2. Each of the sets of signal names are coupled to a different storage cell within the Flop12 multibit flop. 11Since the TwoFlopCell cell includes one header and replaces two OneFlopCells (each of which includes a header), a header is deleted from control unit 10.

Figure 7:
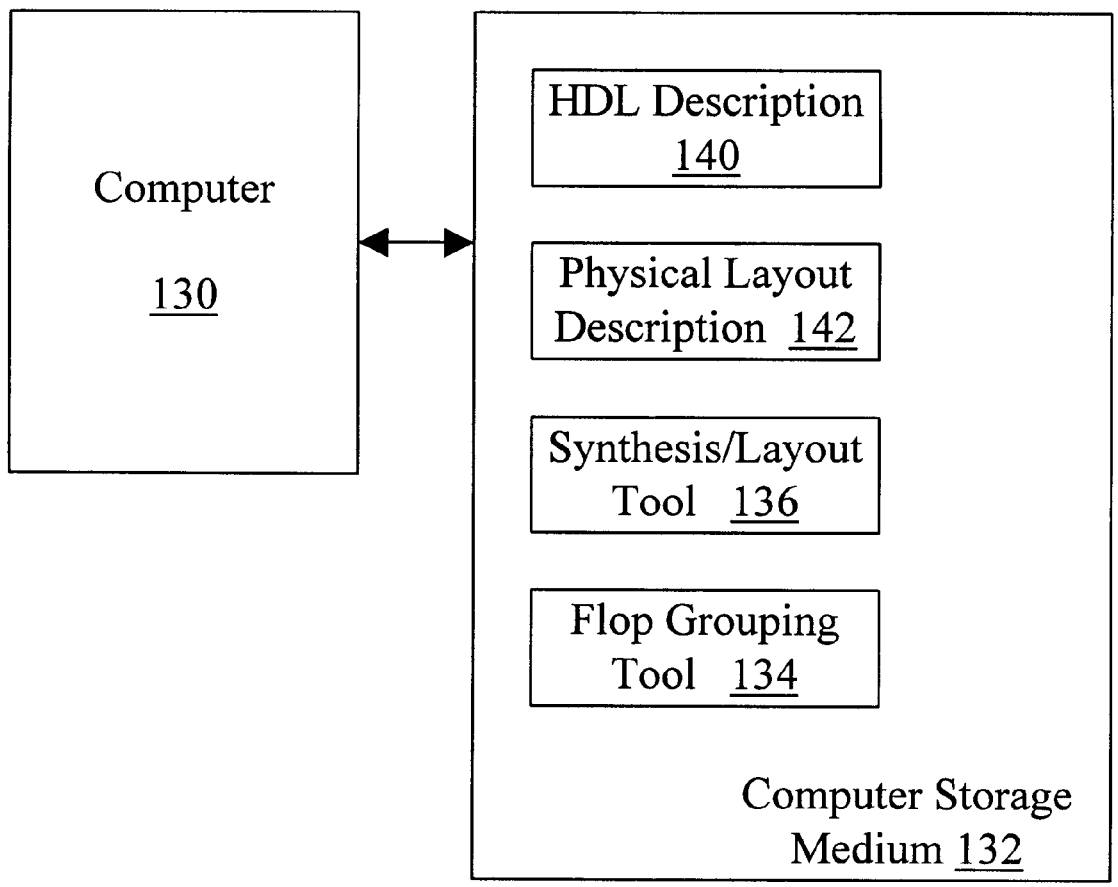
FIG. 7 is a block diagram of a computer system including a flop grouping tool.

Turning next to FIG. 7, an exemplary computer 130 is shown coupled to an exemplary computer storage medium 132. Computer 130 is any kind of general purpose computing device (e.g. a personal computer or a workstation such as those available from Sun Microsystems, Inc. of Palo Alto, Calif.). Computer storage medium 132 is a storage device configured to store programs and data for use by computer 130. Storage medium 132 may be a short term volatile storage such as a random access memory (RAM), or a longer term storage such as a hard disk drive, a floppy disk, a CD-ROM, or other such storage medium. Computer 130 may access computer storage medium 132 to read programs or data to be operated upon by programs. Data generated by executing the programs may be stored onto computer storage medium 132 if computer storage medium 132 is updateable via computer 130.

For the example of FIG. 7, computer storage medium 132 stores flop grouping tool 134. Flog grouping tool 134 comprises a set of instructions arranged to perform flop grouping functions as described herein. Additionally, computer storage medium 132 may store synthesis/layout tool 136. Synthesis/layout tool 136 may include a synthesis tool for performing synthesis, a place and route tool for performing place and route, and a timing analyzer for performing timing analysis. Still further, a physical layout description 142 and an HDL description 140 corresponding to a control block 10 may be stored within computer storage medium 132.

It is noted that, although single bit flop cells are shown herein being replaced by multiple bit flop cells, the minimum number of bits stored per original storage device (i.e. prior to flop grouping) may be varied. For example, multiple bit flop cells which are compatible may be combined into even larger flop cells which share a header, in other contemplated embodiments. It is further noted that, although certain steps in the flowcharts shown herein are depicted serially for ease of understanding, steps may be performed in parallel as desired. Furthermore, any ordering of the steps which accomplishes a suitable result may be used.

In accordance with the above disclosure, a methodology has been described for merging compatible storage devices for reducing the area occupied by the storage devices. Advantageously, area occupied by a control block employing the storage devices may be decreased. Accordingly, the area occupied by an integrated circuit may be decreased. Because the control block occupies less area, timing benefits may be realized as well.

Numerous variations and modifications will become apparent to those skilled in the art once the above disclosure is fully appreciated. It is intended that the following claims be interpreted to embrace all such variations and modifications.

What is claimed is:

1. A method for reducing the area occupied by a control block, comprising:

identifying a first group of storage devices within said control block, said first group of storage devices each including a first header; and selecting a first storage device from said first group and a second storage device from said first group for replacement by a first merged storage device having said first header and storage corresponding to said first storage device and said second storage device;

whereby an instance of said first header is deleted from said control block.

2. The method as recited in claim 1 further comprising identifying a second group of storage devices within said control block, said second group of storage devices each including a second header different than said first header.

3. The method as recited in claim 2 further comprising selecting a third storage device from said second group and a fourth storage device from said second group for replacement by a second merged storage device having said second header and storage corresponding to said third storage device and said fourth storage device, whereby an instance of said second header is deleted from said control block.

4. The method as recited in claim 1 further comprising identifying a first subgroup of storage devices within said first group, said first subgroup of storage devices each having data pins which collectively comprise a bus.

5. The method as recited in claim 4 wherein said first storage device and said second storage device are within said first subgroup.

6. The method as recited in claim 4 further comprising identifying a second subgroup of storage devices within said first group, said second subgroup comprising remaining storage devices within said first group which are not within said first subgroup.

7. The method as recited in claim 6 further comprising selecting a third storage device from said second subgroup and a fourth storage device from said second subgroup for replacement by a second merged storage device having said first header and storage corresponding to said third storage device and said fourth storage device, whereby an instance of said first header is deleted from said control block.

8. The method as recited in claim 1 further comprising iterating said identifying and said selecting a predetermined number of iterations.

9. The method as recited in claim 8 wherein said first storage device comprises said first merged storage device during a second iteration of said selecting.

10. The method as recited in claim 1 further comprising modifying a netlist corresponding to said control block by removing said first storage device and said second storage device from said netlist and inserting said first merged storage device into said netlist.

11. The method as recited in claim 10 further comprising performing place and route upon said netlist subsequent to said modifying.

12. A method for reducing the area occupied by a control block, comprising:
    identifying a first storage device and a second storage device within said control block, wherein said first storage device includes a first header and a first storage cell connected to said first header, and wherein said second storage device includes a second header and a second storage cell connected to said second header, and wherein said first header and said second header are configured to receive a same set of signals; and
    replacing said first storage device and said second storage device with a first merged storage device including said first header, said first storage cell connected to said first header, and said second storage cell connected to said first header;
    whereby said second header is deleted from said control block.

13. The method as recited in claim 12 further comprising identifying a third storage device within said control block, wherein said third storage device includes a third header and a third storage cell connected to said third header, and wherein said first header and said third header are configured to receive a same set of signals.

14. The method as recited in claim 13 further comprising replacing said first merged storage device and said third storage device with a second merged storage device including said first header, said first storage cell connected to said first header, and said second storage cell connected to said first header, and said third storage cell connected to said first header, whereby said third header is deleted from said control block.

15. The method as recited in claim 14 further comprising identifying a fourth storage device within said control block, wherein said fourth storage device includes a fourth header and a fourth storage cell connected to said fourth header, and wherein said first header and said fourth header are configured to receive a same set of signals.

16. The method as recited in claim 15 further comprising replacing said second merged storage device and said fourth storage device with a third merged storage device including said first header, said first storage cell connected to said first header, and said second storage cell connected to said first header, said third storage cell connected to said first header, and said fourth storage cell connected to said first header, whereby said fourth header is deleted from said control block.

17. The method as recited in claim 16 wherein said replacing said first storage device, said replacing said first merged storage device, and said replacing said second merged storage device each comprise modifying a netlist corresponding to said control block.

18. The method as recited in claim 17 wherein said replacing said first storage device, said replacing said first merged storage device, and said replacing said second merged storage device each further comprise performing place and route upon said netlist subsequent to said modifying.

19. The method as recited in claim 13 further comprising inhibiting replacing said first merged storage device and said third storage device with a second merged storage device if a first output of said first storage device and a second output of said second storage device comprise a bus and a third output of said third storage device is excluded from said bus.

20. The method as recited in claim 19 further comprising identifying a fourth storage device within said control block, wherein said fourth storage device includes a fourth header and a fourth storage cell connected to said fourth header, and wherein said first header and said fourth header are configured to receive a same set of signals, and wherein a fourth output of said fourth storage device is excluded from said bus.

21. The method as recited in claim 20 further comprising replacing said third storage device and said fourth storage device within a second merged storage device including said first header, said third storage cell connected to said first header, and said fourth storage cell connected to said first header.

22. A computer storage medium configured to store a grouping program including a plurality of instructions configured to:
    (i) identify a first group of storage devices within a control block, said first group of storage devices each including a first header; and
    (ii) select a first storage device within said first group and a second storage device within said first group for replacement by a first merged storage device having said first header and storage corresponding to said first storage device and said second storage device;
    whereby an instance of said first header is deleted from said control block.

23. The computer storage medium as recited in claim 22, wherein said plurality of instructions are further configured to:
    (iii) iterate said identify and said select a predetermined number of times; and
    (iv) select said first merged storage device as aid first storage device during a subsequent iteration.

* * * * *